United States Patent
Hellberg

(10) Patent No.: US 9,712,118 B2
(45) Date of Patent: Jul. 18, 2017

(54) AMPLIFIER CIRCUIT AND METHOD

(71) Applicant: TELEFONAKTIEBOLAGET L M ERICSSON (PUBL), Stockholm (SE)

(72) Inventor: Richard Hellberg, Huddinge (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/891,935

(22) PCT Filed: May 27, 2013

(86) PCT No.: PCT/SE2013/050605
§ 371 (c)(1),
(2) Date: Nov. 17, 2015

(87) PCT Pub. No.: WO2014/193275
PCT Pub. Date: Dec. 4, 2014

(65) Prior Publication Data
US 2016/0126902 A1 May 5, 2016

(51) Int. Cl.
| | | |
|---|---|---|
| H03F 3/68 | (2006.01) | |
| H03F 1/02 | (2006.01) | |
| H03F 1/56 | (2006.01) | |
| H03F 3/60 | (2006.01) | |
| H03H 7/01 | (2006.01) | |
| H01P 5/16 | (2006.01) | |

(Continued)

(52) U.S. Cl.
CPC ............ *H03F 1/0288* (2013.01); *H01P 5/16* (2013.01); *H03F 1/0294* (2013.01); *H03F 1/565* (2013.01);
(Continued)

(58) Field of Classification Search
CPC .......... H03F 1/0288; H03F 3/19; H03F 3/602; H03F 3/68; H03F 3/211; H03F 3/605;
(Continued)

(56) References Cited

U.S. PATENT DOCUMENTS

| | | |
|---|---|---|
| 5,111,157 A | 5/1992 | Komiak |
| 6,940,349 B2 | 9/2005 | Hellberg |

(Continued)

FOREIGN PATENT DOCUMENTS

| | | |
|---|---|---|
| WO | 2004023647 A1 | 3/2004 |
| WO | 2004057755 A1 | 7/2004 |

(Continued)

OTHER PUBLICATIONS

Chireix, High power outphasing modulation, Proceedings of the Institute of Radio Engineers, vol. 23, No. 11, pp. 1370-1392, Nov. 1935.
(Continued)

*Primary Examiner* — Khanh V Nguyen

(57) ABSTRACT

An amplifier circuit comprises a first amplifier configured to amplify a first input signal. The output of the first amplifier is coupled to an output node via a first transmission line, the first transmission line comprising a first portion having a first characteristic impedance and a first length, and a second portion having a second characteristic impedance and a second length. A second amplifier is configured to amplify a second input signal. The output of the second amplifier is coupled to the output node via a second transmission line, the second transmission line comprising a first portion having a first characteristic impedance and a first length, and a second portion having a second characteristic impedance and a second length. An auxiliary amplifier is configured to amplify a third input signal. The output of the auxiliary amplifier is coupled via an auxiliary transmission line network to a first intersection between the first and second portions of the first transmission line, and to a second intersection between the first and second portions of the second transmission line.

17 Claims, 11 Drawing Sheets

(51) Int. Cl.
*H03F 3/19* (2006.01)
*H03F 3/21* (2006.01)

(52) U.S. Cl.
CPC ............... *H03F 3/19* (2013.01); *H03F 3/211* (2013.01); *H03F 3/602* (2013.01); *H03H 7/0123* (2013.01); *H03F 2200/408* (2013.01); *H03F 2200/423* (2013.01); *H03F 2200/451* (2013.01); *H03F 2200/543* (2013.01); *H03F 2203/21106* (2013.01)

(58) Field of Classification Search
CPC .......... H03F 1/07; H03F 1/0294; H03F 1/565; H01P 5/16; H03H 7/0123
USPC ................................................ 330/124 R, 295
See application file for complete search history.

(56) References Cited

U.S. PATENT DOCUMENTS

| | | | | |
|---|---|---|---|---|
| 8,441,321 B2* | 5/2013 | Hellberg | ............... | H03F 1/0288 330/124 R |
| 8,717,099 B2* | 5/2014 | Wilson | ................. | H03F 1/0288 330/124 R |
| 2006/0017500 A1 | 1/2006 | Hellberg | | |
| 2006/0114060 A1* | 6/2006 | Hellberg | ............... | H03F 1/0205 330/124 R |
| 2008/0136554 A1 | 6/2008 | He et al. | | |
| 2010/0117727 A1 | 5/2010 | Dawnson et al. | | |
| 2014/0062601 A1* | 3/2014 | Acimovic | ............. | H03F 1/0288 330/295 |
| 2014/0333379 A1* | 11/2014 | Aust | ...................... | H03F 3/217 330/251 |

FOREIGN PATENT DOCUMENTS

| | | |
|---|---|---|
| WO | 2005031966 A1 | 4/2005 |
| WO | 2010068152 A1 | 6/2010 |

OTHER PUBLICATIONS

Doherty, A new high efficiency power amplifier for modulated waves, Proceedings of the Institute of Radio Engineers, vol. 24, No. 9, pp. 1163-1182, Sep. 1936.

* cited by examiner

AMPLIFIER CIRCUIT AND METHOD

This application is a 371 of International Application No. PCT/SE2013/050605, filed May 27, 2013, the disclosure of which is fully incorporated herein by reference.

TECHNICAL FIELD

The present invention relates generally to an amplifier circuit and method, and more particularly to an amplifier circuit and method which provides improved efficiency, for example an amplifier circuit comprising at least first and second amplifiers configured to operate in Chireix and Doherty modes of operation.

BACKGROUND

Power amplifiers are often used to amplify wideband signals or signal combinations with high peak to average power ratio, PAR. The amplifiers must then be able to repeatedly output very high power for very short periods, even though the bulk of the output power is generated at the much lower average power level. In systems with random phase combinations of many signals (without any dominating ones) the amplitude of the signal follows a Rayleigh distribution.

A conventional single-transistor power amplifier (for example a class B, AB or F power amplifier) has a fixed radio frequency (RF) load resistance and a fixed voltage supply. The bias in class B or AB amplifiers causes the output current to have a form close to that of a pulse train of half wave rectified sinusoid current pulses. The direct current (DC) current (and hence DC power) is therefore largely proportional to the RF output current amplitude (and voltage). The output power, however, is proportional to the RF output current squared. The efficiency, i.e. output power divided by DC power, is therefore also proportional to the output amplitude. The average efficiency of a power amplifier is consequently low when amplifying signals that on average have a low output amplitude (or power) compared to the maximum required output amplitude (or power), i.e. high PAR.

It is known to have power amplifiers configured to operate in a Doherty mode or a Chireix mode of operation, based on multiple transistors with passive output network interaction and combination. Such power amplifiers are much more efficient than conventional amplifiers for amplitude-modulated signals that have a high peak-to-average ratio (PAR), since they have a much lower average sum of output currents from the amplifier transistors. It will be appreciated that such a reduced average output current leads to high average efficiency.

The reduced average output current is obtained by using two amplifier transistors that influence the output voltages and currents of each other through a reactive output network, the reactive output network also being coupled to the load. By driving the constituent amplifier transistors with suitable amplitudes and phases, the sum of RF output currents is reduced at all levels except the maximum. Also, for these amplifiers the RF voltage at one or both transistor outputs is increased. The reduced RF output currents are essentially obtained by having high transimpedance from at least one transistor to the output, while having the possibility of in-phase combining all transistor outputs to obtain full output power. Reduced average output current means high average efficiency since the DC current is largely proportional to the RF current magnitude.

The field was generalized for two-transistor structures, for example by "Unified High-Efficiency Amplifiers", published as EP1470635 by the present Applicant. This discloses a 2-stage high-efficiency amplifier with increased robustness against circuit variations, that can avoid tuning of the output network, and with radically increased bandwidth of high efficiency. The amplifier consists in having a longer and a shorter transmission line from two amplifier transistors to a common output (which is coupled to a load, $R_{LOAD}$). If the most wideband operation is desired, the lengths of the transmission lines are chosen such that the longer line has an electrical length of half a wavelength at center frequency, while the shorter line has an electrical length of a quarter wavelength at center frequency. The basic structure of such an amplifier is shown in FIG. 1.

The amplifier circuit 10 of FIG. 1 comprises a first amplifier 5 located in a first or "main" branch 1 of the amplifier circuit 10 and a second amplifier 6 located in a second or "auxiliary" branch 3 of the amplifier circuit 10. An output of the first amplifier 5 and an output of the second amplifier 6 are coupled to a common output 9 via respective first and second transmission lines 7 and 8. As mentioned above, the first and second transmission lines 7, 8 form a reactive output network which influences the operation of the first and second amplifiers 5, 6. The electrical length of the first transmission line 7 can be designed to be shorter than the electrical length of the second transmission line 8 (for example a quarter wavelength and a half wavelength, respectively, at center frequency, as shown). In operation, an input signal 4 is received by the amplifier circuit 10, split by a signal component separator 2 and amplified by the first amplifier 5 and the second amplifier 6.

The amplifier circuit 10 has a wide bandwidth of high efficiency since the shorter/longer transmission lines 7, 8 of the output network form different kinds of amplifiers at different frequencies. Around a center frequency of operation the amplifier circuit 10 operates as a Doherty amplifier, and at 2/3 and 4/3 of that frequency the amplifier circuit 10 operates as a Chireix amplifier. The wide (about 3 to 1) high efficiency bandwidth is thus achieved in such an amplifier circuit 10 by devising an output network that has both suitable impedance transformation characteristics and full power output capacity over a wide bandwidth, together with a unified control system that allows high efficiency operation at all "modes" across that bandwidth. The amplifier circuit 10 of FIG. 1 therefore allows operation in between and outside the intrinsically narrowband Doherty and Chireix modes.

Further developments of the type of circuit shown in FIG. 1 include three basic expandable multi-transistor structures (and ways to drive them efficiently), for example as disclosed in U.S. Pat. No. 7,221,219 by the present Applicant. Amplifiers such as these, based on passive output network interaction structures, have the advantage of needing only fundamental radio frequency (RF) network and signal modifications.

The reduced average output current mentioned above also comes with a drawback. The RF voltage swing at some transistors is increased, often to the maximum possible. This makes the amplifiers sensitive to resistive losses in a shunt path at the outputs of the transistors, i.e. between the drain and ground, since the loss power is proportional to the RF voltage swing squared. The most common causes of shunt loss are the small series resistance of the capacitance at the drain node, or coupling to a lossy substrate via the drain capacitance (Cds). These capacitively coupled losses often increase almost quadratically with frequency.

Peak power reduction (clipping, crest factor reduction (CFR)) is a method of reducing the peak power of a signal to be transmitted. With conventional single-transistor amplifiers this consequentially increases efficiency. Contrarily, amplifiers such as those described above can, with proper dimensioning, have efficiency almost independent of PAR.

Peak power reduction methods can in some systems reduce the peak power greatly, but while doing so they increase the noise level (EVM) in the signal. This decreases the signal to noise ratio, SNR, of the signal at the receiver, and will thus require a boost in average signal power to compensate for this.

This increase in average power will increase both the DC power drawn and the loss power in the amplifier. For example a commonly found compensatory 1 dB increase in average power increases the DC power drawn by 25% and thus decreases the "equivalent efficiency" to only 80% of the measured efficiency.

It is therefore beneficial to the system to use as little peak power reduction as possible. The ideal solution would be to have the possibility of high peak output power to cope with the peaks of high-PAR signals, while at the same time having high efficiency around the average power level.

Chireix-Doherty amplifiers have the potential of very high average efficiency for signals with high PAR. To achieve this, however, the transistors should have low shunt loss, i.e. resistive loss between the drain and ground nodes. Such transistors are generally more expensive than transistors with high loss. As mentioned above, the most common causes of shunt loss is the series resistance of the capacitance at the drain node, or coupling to a lossy substrate via the drain capacitance (Cds).

SUMMARY

It is an aim of the present invention to provide a method and apparatus which obviate or reduce at least one or more of the disadvantages mentioned above, for example by allowing the peak power to be increased while retaining average efficiency at a low cost.

According to a first aspect of the present invention there is provided an amplifier circuit. The amplifier circuit comprises a first amplifier configured to amplify a first input signal, wherein an output of the first amplifier is coupled to an output node via a first transmission line, the first transmission line comprising a first portion having a first characteristic impedance and a first length, and a second portion having a second characteristic impedance and a second length. The amplifier circuit comprises a second amplifier configured to amplify a second input signal, wherein an output of the second amplifier is coupled to the output node via a second transmission line, the second transmission line comprising a first portion having a first characteristic impedance and a first length, and a second portion having a second characteristic impedance and a second length. The amplifier circuit further comprises an auxiliary amplifier configured to amplify a third input signal, wherein an output of the auxiliary amplifier is coupled via an auxiliary transmission line network to a first intersection between the first and second portions of the first transmission line, and to a second intersection between the first and second portions of the second transmission line.

According to another aspect of the present invention there is provided a method in an amplifier circuit. The method comprises the step of amplifying a first input signal using a first amplifier, and coupling the amplified first input signal to an output node via a first transmission line, the first transmission line comprising a first portion having a first characteristic impedance and a first length, and a second portion having a second characteristic impedance and a second length. The method also comprises the step of amplifying a second input signal using a second amplifier, and coupling the amplified second input signal to the output node via a second transmission line, the second transmission line comprising a first portion having a first characteristic impedance and a first length, and a second portion having a second characteristic impedance and a second length. The method further comprises the step of amplifying a third input signal using an auxiliary amplifier, and coupling the output of the auxiliary amplifier via an auxiliary transmission line network to a first intersection between the first and second portions of the first transmission line, and to a second intersection between the first and second portions of the second transmission line.

BRIEF DESCRIPTION OF THE DRAWINGS

For a better understanding of the present invention, and to show more clearly how it may be carried into effect, reference will now be made, by way of example only, to the following drawings in which.

DETAILED DESCRIPTION

The embodiments of the invention as described below provide a new type of amplifier arrangement which is aimed at being more efficient, for example when operating with Chireix-Doherty behavior. On the one hand the amplifier arrangements according to embodiments of the invention provide a peak amplifier for handling peak output power levels while, on the other hand, at low output power levels, also provide extremely low sensitivity to any shunt loss in the peak amplifier.

As will be described in greater detail below, the embodiments of the invention achieve this through circuit arrangements which ensure the RF voltage swing at the peak amplifier is very low when output power levels are low, which as a consequence means that the shunt loss resistance of the peak amplifier only draws very little RF current. This has the advantage that the peak amplifier can thus be both large and use a cheaper transistor technology.

The embodiments of the invention describe amplifier circuits (or their equivalent circuits) that can be realized in different ways to achieve the desired aim of having low voltage swing at the peak amplifier during low output power levels.

Figure 1:
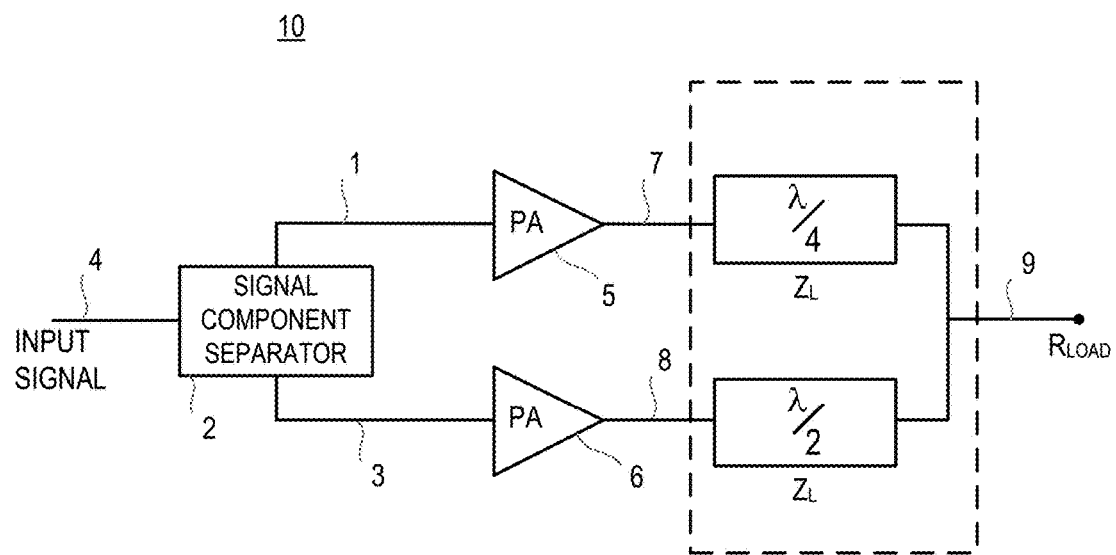
FIG. 1 shows an amplifier circuit according to the prior art.
Figure 2:
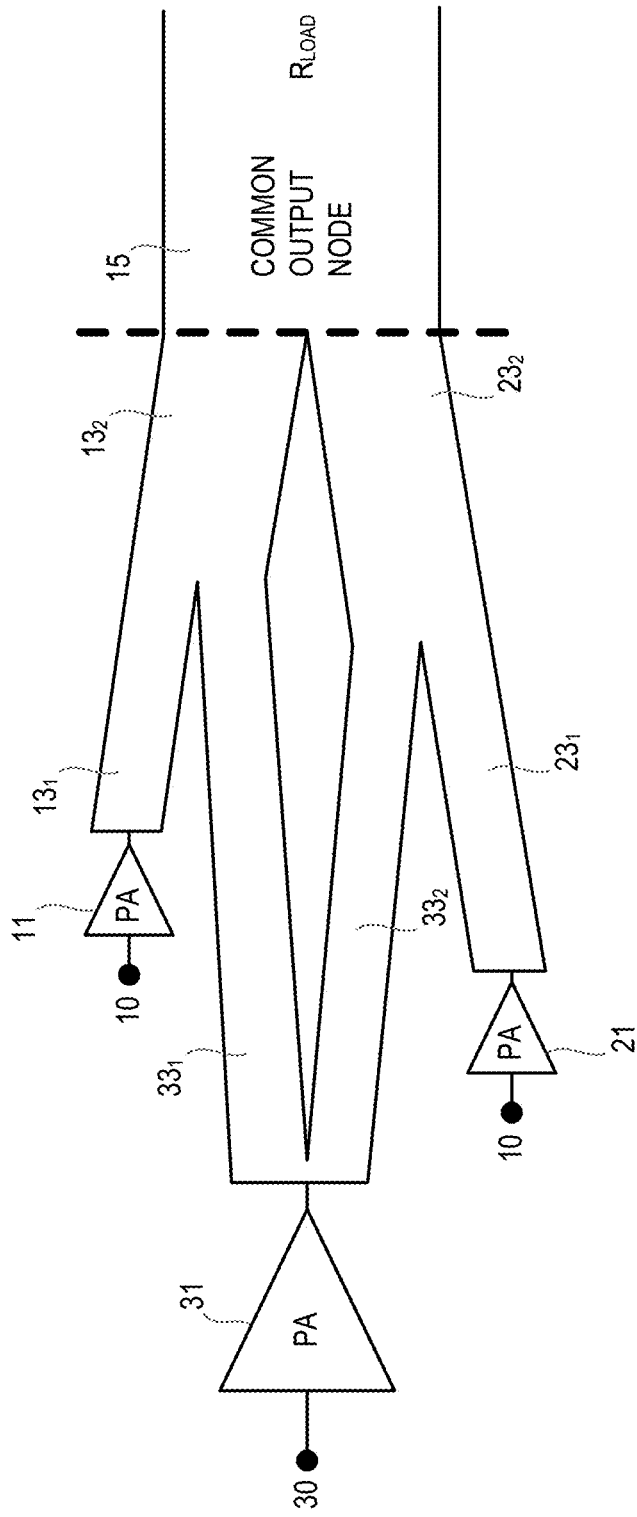
FIG. 2 shows an amplifier circuit according to an embodiment of the invention.

FIG. 2 shows an amplifier circuit 100 according to an embodiment of the invention. The amplifier circuit 100 comprises a first amplifier 11 configured to amplify a first input signal 10. An output of the first amplifier 11 is coupled to an output node 15 via a first transmission line 13. The first transmission line 13 comprises a first portion $13_1$ having a first characteristic impedance and a first length, and a second portion $13_2$ having a second characteristic impedance and a second length.

The amplifier circuit 100 also comprises a second amplifier 21 configured to amplify a second input signal 20. An output of the second amplifier 21 is coupled to the output node 15 via a second transmission line 23. The second transmission line 23 comprises a first portion $23_1$ having a first characteristic impedance and a first length, and a second portion $23_2$ having a second characteristic impedance and a second length.

The amplifier circuit 100 also comprises an auxiliary amplifier 31 (also referred to herein as a peak amplifier) configured to amplify a third input signal 30. An output of the auxiliary amplifier 31 is coupled via an auxiliary transmission line network ($33_1$, $33_2$) to a first intersection between the first and second portions $13_1$, $13_2$ of the first transmission line 13, and to a second intersection between the first and second portions $23_1$, $23_2$ of the second transmission line 23.

By arranging the amplifier circuit in this way, the output network can be configured such that the auxiliary amplifier 31 is able to perform the same task as in a prior art Chireix-Doherty amplifier circuit in the upper part of the amplitude range, but having lower RF voltage swing in the low amplitude range (i.e. when the first and second amplifiers 11, 21 are operating as a Chireix pair). This enables a lower quality/cost amplifier to be used as the auxiliary amplifier 31, without having the disadvantages associated with prior art systems As will be described in greater detail below, the lengths and/or characteristic impedances of the first and second transmission lines 13, 23 and the auxiliary transmission line network $33_1$, $33_2$ are configured such that, during use, a low voltage swing is experienced by the auxiliary amplifier 31 for output signals having a low amplitude range.

Operation of the three-amplifier system shown in FIG. 2 (and the other embodiments of the invention) can be subdivided into three main regions. At low output amplitudes, the first and second amplifiers 11, 21 are driven to supply linearly increasing (with respect to the output amplitude) currents with a constant phase angle between them. The upper boundary of this region is determined by the size of the reactances, X, or equivalently, by the line length difference, δ. This parameter may be chosen so that the average efficiency is maximized for the signal amplitude distribution used, by placing the lowermost efficiency maximum at a certain output amplitude point. At medium output amplitudes, the first and second amplifiers 11, 21 are driven in an outphasing fashion, with constant amplitudes and varying relative phase of their output node voltages. The upper boundary of the middle region is determined by the relation between the sum of the maximum output powers of the first and second amplifiers 11, 21 to the sum of all three amplifiers' maximum output power. At high output amplitudes the first and second amplifiers are held at constant voltage and constant phase difference while together supplying a linearly increasing output current. In this region the third amplifier 31 is also active, supplying a linearly increasing current starting from zero.

Figure 3:
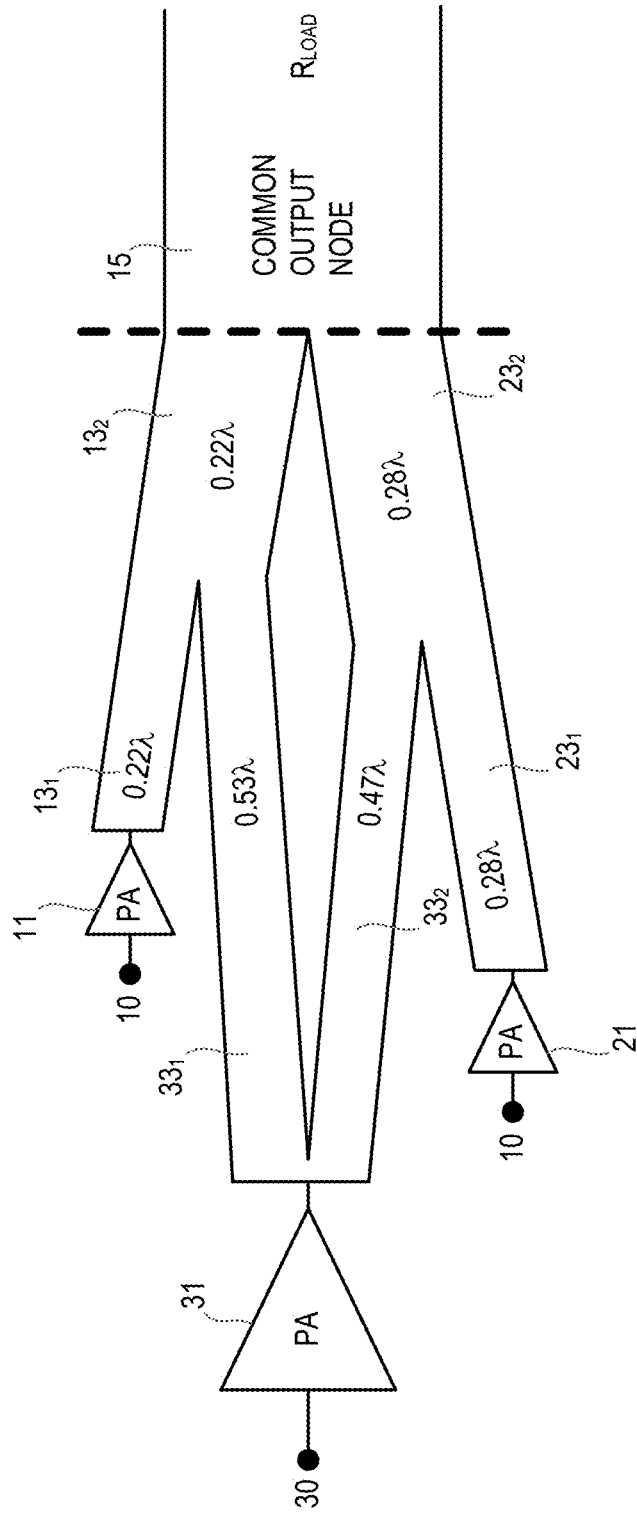
FIG. 3 shows an example illustrating further details of the embodiment of FIG. 2.

FIG. 3 shows further details of an amplifier circuit according to one example embodiment. According to this embodiment the length of the first portion $13_1$ of the first transmission line 13 is substantially equal to the length of the second portion $13_2$ of the first transmission line 13, and/or wherein the length of the first portion $23_1$ of the second transmission line 23 is substantially equal to the length of the second portion $23_2$ of the second transmission line 23. For example, the first and second portions $13_1$, $13_2$ of the first transmission line 13 are shown has having substantially equal lengths of 0.22λ, while the first and second portions $23_1$, $23_2$ of the second transmission line 23 are shown has having substantially equal lengths of 0.28λ.

By making the lengths of the first and second portions substantially equal, this has the benefit that, together with the effect of the other line lengths and drive signals, the third amplifier 31 receives a low RF voltage, while the first and second amplifiers 11 and 21 operate as a Chireix pair, at low output amplitudes.

According to the example of FIG. 3, it can also been seen that this particular embodiment is configured such that the first and/or second portions $13_1$, $13_2$ of the first transmission line 13 are a first predetermined length Δ1 shorter than an odd multiple of a quarter wavelength, and wherein the first and/or second portions $23_1$, $23_2$ of the second transmission line are a second predetermined length Δ2 longer than an odd multiple of a quarter wavelength. In the example the first and second portions $13_1$, $13_2$ of the first transmission line 13 are a first predetermined length Δ1=0.03λ shorter than a quarter wavelength (i.e. 0.25λ−0.03λ=0.22λ), with the first and second portions $23_1$, $23_2$ of the second transmission line 23 being a second predetermined length Δ2=0.03λ longer than a quarter wavelength (i.e. 0.25λ+0.03λ=0.28λ).

By making one transmission line shorter and one transmission line longer than a quarter length (or multiple thereof), this has the benefit that, together with the effect of the other line lengths and drive signals, the third amplifier 31 receives a low RF voltage, while the first and second amplifiers 11 and 21 operate as a Chireix pair, at low output amplitudes.

In the example shown in FIG. 3 the first predetermined length Δ1 is substantially equal to the second predetermined length Δ2, i.e. 0.03λ in the example.

It is noted that the first and second transmission lines can be made shorter and longer, respectively, by different amounts, without departing from the scope of the invention. However, by having the transmission lines being made shorter/longer by a substantially equal amount, for example 0.22λ/0.28λ, or 0.06λ/0.44λ, this has the advantage that, together with the effect of the other line lengths and drive signals, the third amplifier 31 receives a low RF voltage, while the first and second amplifiers 11 and 21 operate as a Chireix pair, at low output amplitudes. It is noted that the size of the electrical length difference determines the efficiency at low outputs and correspondingly the amplitude where "outphasing" starts (as explained later in FIG. 5b). An embodiment having equal amounts of lengthening/shortening has the advantage of providing symmetric Chireix operation, which can simplify drive signal generation. An embodiment having unequal amounts can provide higher average efficiency, but with more complex drive signal generation being required.

An explanation will now be provided regarding how the characteristic impedance of each portion of transmission line can be configured according to different embodiments of the present invention. The characteristic impedance of the first portion $13_1$ of the first transmission line 13 is substantially N times the characteristic impedance of the second portion $13_2$ of the first transmission line 13. For example, in the embodiment of FIG. 3 the characteristic impedance of the first portion $13_1$ of the first transmission line 13 is substantially twice the characteristic impedance of the second portion $13_2$ of the first transmission line 13 (illustrated by the respective thicknesses of the first and second portions $13_1$, $13_2$ in FIG. 3).

Likewise, the characteristic impedance of the first portion $23_1$ of the second transmission line 23 is substantially N times the characteristic impedance of the second portion $23_2$ of the second transmission line 23. For example, in the embodiment of FIG. 3 the characteristic impedance of the first portion $23_1$ of the second transmission line 23 is substantially twice the characteristic impedance of the second portion $23_2$ of the second transmission line 23 (illustrated by the respective thicknesses of the first and second portions $23_1$, $23_2$ in FIG. 3).

In the embodiment of FIG. 3 it can therefore be seen that the characteristic impedances of the second portions $13_2$, $23_2$ of the first and second transmission lines 13, 23 are substantially N times the characteristic impedance of a load impedance $R_{LOAD}$ of the output node 15. For example, in the embodiment of FIG. 3 the characteristic impedances of the second portions $13_2$, $23_2$ of the first and second transmission lines 13, 23 are substantially twice the characteristic impedance of the load impedance of the output node 15 (again illustrated by the respective thicknesses of the second portions $13_2$, $23_2$ of the first and second transmission lines 13, 23 compared to the load impedance at the output node 15).

It is noted, however, that the characteristic impedances can be any multiple of one another, or any relationship. According to one embodiment an advantage is obtained by making both transistors of the Chireix pair (i.e. the first and second amplifiers 11, 21) of equal size, with equal transmission line impedances. The third transistor 31 and its transmission lines can have any relation to these, in theory, but due to the limited number of transistor sizes of a specific technology, from a practical viewpoint an embodiment can have a relationship which provides multiples of small numbers (such as 1 or 2). As such, a 1-1-2 size relation between the first, second and third amplifiers, as provided in the example, has been found to work well with typical signal amplitude distributions. It is noted, however, that if different technologies are used for the various amplifiers, such as Chireix pair transistors (GaN, GaAs) for the first and second amplifiers, and a peaking transistor (Si) for the third amplifier, in such an example whole number relations could be the exception.

An explanation will now be provided regarding how the auxiliary transmission line network can be configured according to an embodiment of the present invention.

In the embodiment of FIG. 3 the auxiliary transmission line network comprises a first auxiliary transmission line $33_1$ coupling the output of the auxiliary amplifier 31 to the first intersection in the first transmission line 13, and a second auxiliary transmission line $33_2$ coupling the output of the auxiliary amplifier 31 to the second intersection of the second transmission line 23.

In this embodiment of FIG. 3 the length of the first auxiliary transmission line $33_1$ is longer than the length of the second auxiliary transmission line $33_2$. In one example, the length of the first auxiliary transmission line $33_1$ and second auxiliary transmission line $33_2$ are an equal predetermined length longer and shorter, respectively, than N times a quarter wavelength. For example, in the embodiment of FIG. 3 the first auxiliary transmission line $33_1$ has a length of $0.53\lambda$ and the second auxiliary transmission line $33_2$ a length of $0.47\lambda$.

According to this example it can be seen that the first auxiliary transmission line $33_1$ is longer, and the second auxiliary transmission line $33_2$ shorter, than a half wavelength (i.e. $0.5\lambda$) by a substantially equal amount (i.e. longer and shorter by $0.03\lambda$ respectively). It can be seen from this example that the 0.03 value is the same as the value for the first and second transmission lines. This is because, according to this embodiment, the total transmission line length from the third amplifier 31 to the output is the same for both the upper path and the lower path, hence the shortening/lengthening being the same amount. For full output, the waves will then combine at the output in phase (this is achieved for the two other amplifiers 11, 21 by adjusting the phases of their input signals relative that of the third amplifier 31). It is noted that a small mismatch does not provide problems in practice since it only gives a small reduction in maximum output power (similar to other circuit variations).

According to one embodiment the characteristic impedance of the first and second auxiliary transmission lines $33_1$, $33_2$ are substantially equal (as illustrated by the equal thicknesses of the first and second auxiliary transmission lines as shown in FIG. 3).

Furthermore, according to one example the characteristic impedance of the first and second auxiliary transmission lines $33_1$, $33_2$ are substantially equal to the characteristic impedance of the first portions $13_1$, $23_1$ of the first and second transmission lines 13, 23 (again as illustrated by sections of equal thickness in FIG. 3).

In summary, in the embodiment of FIG. 3 the first component amplifier 11 (fed by input signal 10) is connected by a first portion $13_1$ of a first transmission line 13 of length $0.22\lambda$ to a second portion $13_2$ of the first transmission line 13, of substantially equal length $0.22\lambda$, wherein the second portion $13_2$ is of lower characteristic impedance compared to the first portion $13_1$ (for example halved, illustrated by a doubling of the line width). This wider second portion $13_2$ is connected to a common output load, illustrated by a transmission line of characteristic impedance $R_{load}$ continuing indefinitely to the right. To the junction where the wider transmission line starts (i.e. the intersection between the first and second portions $13_1$, $13_2$ of the first transmission line 13) is also connected an auxiliary transmission line $33_1$ of length $0.53\lambda$, that originates at the output of the auxiliary amplifier 31. The narrower lines of the transmission lines each have a characteristic impedance of 4 times $R_{load}$ and the wider line has a characteristic impedance of 2 times $R_{load}$. It is noted that other multiples or ratios may be used.

The second component amplifier 20 is connected by a first portion $23_1$ of the second transmission line 23 of length $0.28\lambda$ to a second portion $23_2$ of the second transmission line 23 of lower characteristic impedance, also of length $0.28\lambda$, which in turn is connected to the common output 15. To the junction where the wider transmission line starts (i.e. the intersection between the first and second portions $23_1$, $23_2$ of the second transmission line 23) is also connected a second auxiliary transmission line $33_2$ of length $0.47\lambda$, that originates at the output of the auxiliary amplifier 31. Also here the narrower lines have characteristic impedances of 4 times $R_{load}$ and the wider line has a characteristic impedance of 2 times $R_{load}$.

In the output interaction network shown in the embodiment of FIG. 3, the first and second amplifiers 11 and 21 form a Chireix pair which operates largely by itself at low output amplitudes, providing substantially all of the output power while consuming very little DC power. The auxiliary amplifier 31 has the function of providing output power only in the high output power range (for example up to half of the output power at full output), and absorbs very little RF power in the low range, due to the low RF voltage swing resulting from the configuration of the output interaction network.

It can therefore be seen that in the embodiment of FIG. 3 the Chireix pair branches, i.e. the first and second transmission lines 13, 23, each consist of a higher-impedance and a lower-impedance transmission line of equal length. These transmission lines are slightly shorter than a quarter wavelength for one branch, the first transmission line 13, and equally longer for the other, the second transmission line 23. The auxiliary (peak) transistor 31 is connected directly to both branches to junctions substantially midpoint, with the branches having lengths slightly longer and shorter than a half wavelength (or zero, or other multiples of a half) by the same amount.

It will be noted that in the embodiment of FIG. 3 the total lengths from the auxiliary amplifier 31 to the output node 15, through both its paths, are substantially equal to a three quarter (or one quarter, or other odd multiples of a quarter) wavelengths.

It is noted that equivalent circuits may be used to realise one or more parts of the arrangement of FIG. 3 without departing from the scope of the invention as defined in the appended claims.

Figure 4:
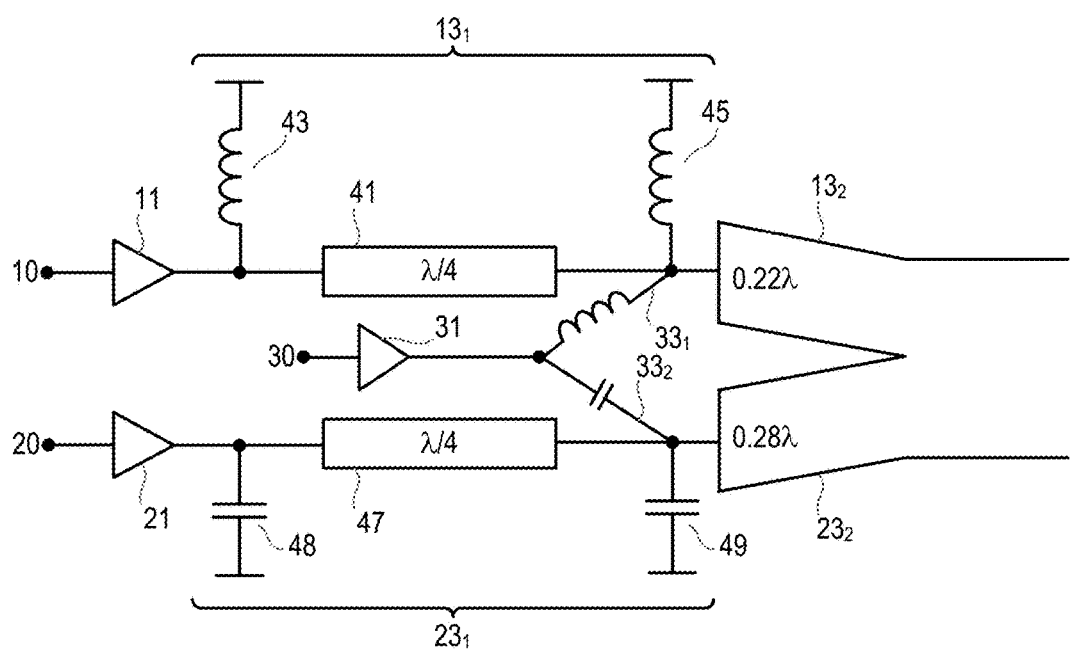
FIG. 4 shows an amplifier circuit according to another embodiment of the invention.

For example, referring to FIG. 4, this shows one example of an embodiment whereby the first portion $13_1$ of the first transmission line 13 of FIG. 3 is shown as being realised using a quarter wave line 41 that is effectively shortened using one or more shunt inductors 43, 45. The second portion $13_2$ of the first transmission line 13 of FIG. 3 may also be realised in this way (or indeed by any other equivalent circuit which achieves the same result).

In the example of FIG. 4 the first portion $23_1$ of the second transmission line 23 of FIG. 3 is shown as being realised using a quarter wave line 47 which is effectively lengthened using one or more shunt capacitors 48, 49. The second portion $23_2$ of the second transmission line 23 of FIG. 3 may also be realised in this way (or indeed by any other equivalent circuit which achieves the same result).

As such, it can be seen from FIG. 4 that the first and/or second portions $13_1$, $13_2$ of the first transmission line 13 comprise a quarter wave line that is effectively shortened using one or more shunt inductors, and wherein the first and/or second portions $23_1$, $23_2$ of the second transmission line comprise a quarter wave line which is effectively lengthened using one or more shunt capacitors.

Thus, FIG. 4 describes an alternative circuit to the embodiment of FIG. 3 where the transmission lines can be made from quarter wavelength lines only, with the quarter wavelength lines being shortened/lengthened respectively using inductors and capacitors. This has the advantage in that only one length of transmission line needs to be used.

In a similar manner, the auxiliary transmission lines from the auxiliary (or peak) amplifier 31, being close to 0.5 wavelengths, can be replaced by a series capacitor for the shortened line, and a series inductor for the lengthened line.

In the embodiments of FIGS. 3 and 4 described above it is noted that the sum of the lengths of the first portions $13_1$, $23_1$ of the first and second transmission lines 13, 23 are substantially equal to 0.5 wavelengths, or multiples thereof, and/or wherein the sum of the lengths of the second portions $13_2$, $23_2$ of the first and second transmission lines 13, 23 are substantially equal to 0.5 wavelengths, or a multiple thereof.

FIGS. 5a to 5d illustrate the behaviours of the RF currents and voltages at the amplifiers (for the first described transmission-line-only circuit of FIG. 3).

Figure 5A:
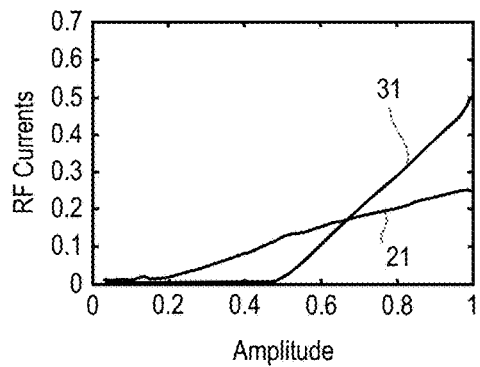
FIGS. 5a to 5d illustrate the behaviour of currents and voltages for the embodiments of FIGS. 2 to 4.

FIG. 5a shows the RF current amplitudes for amplifiers 11, 21 and 31.

Figure 5B:
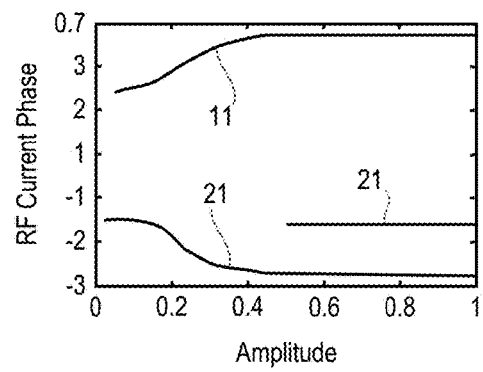

FIG. 5b shows the current phases (relative to the phase of the output signal), for amplifiers 11, 21 and 31.

Figure 5C:
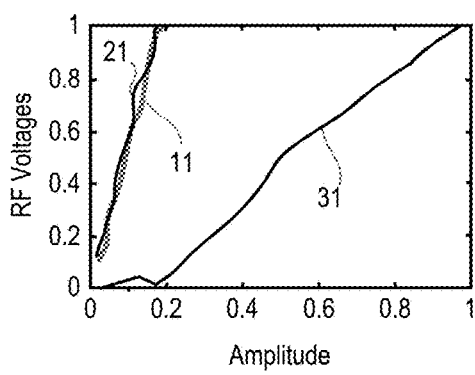

FIG. 5c shows RF voltage amplitudes for amplifiers 11, 21 and 31. It can be seen that there is a very low RF voltage swing at the auxiliary amplifier 31 in the low amplitude region, thereby minimising any losses due to shunt resistance in the auxiliary amplifier 31.

Figure 5D:
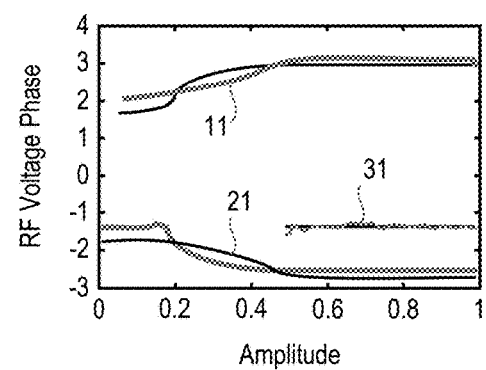

FIG. 5d shows RF voltage phases (thick) and RF current phases (thin lines), for amplifiers 11, 21 and 31.

Figure 6:
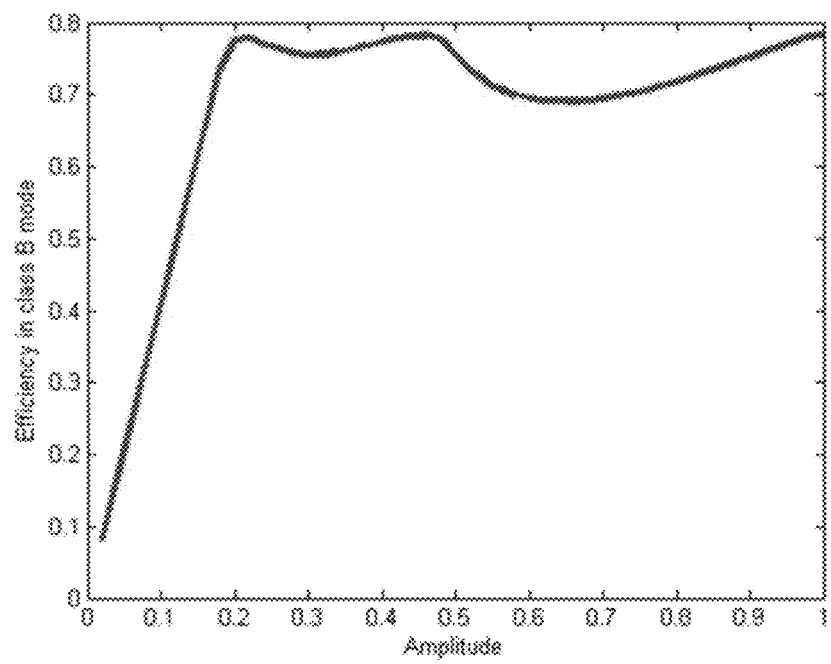
FIG. 6 shows an efficiency curve for an amplifier with class B terminations and low-loss transistors.

FIG. 6 shows the efficiency curve of the amplifier arrangement comprising the first amplifier 11, the second amplifier 21 and the third amplifier 31, with class B terminations and low-loss transistors.

Placement of the middle efficiency peak (slightly below 0.5 of full amplitude in this example) is done primarily by the division of admittance sums between the Chireix pair of amplifier 11, 21 and the auxiliary amplifier 31 (which also reflect their power shares at full output). The lowest efficiency peak (around 0.2 of full amplitude in this example) is determined by the electrical length difference between branches. By having a smaller electric length difference (for example lengths closer to 0.25 lambda) between the line lengths in the Chireix pair amplifiers 11, 21 (0.22 and 0.28 lambda in the example), the first efficiency peak is placed at a lower output amplitude.

The low RF voltage at the auxiliary amplifier 31 means that it can be of a cheaper type with more shunt loss. This is illustrated in the FIG. 7, in which a new amplifier arrangement of the embodiments of FIGS. 3 and 4 is compared with an old prior art Chireix-Doherty amplifier arrangement. Both have auxiliary (peak) amplifiers (transistors) that provide half of the maximum output power, with equivalent values of shunt resistance six times the optimal load resistance at full output, i.e. Rshunt=6×Ropt.

Figure 7:
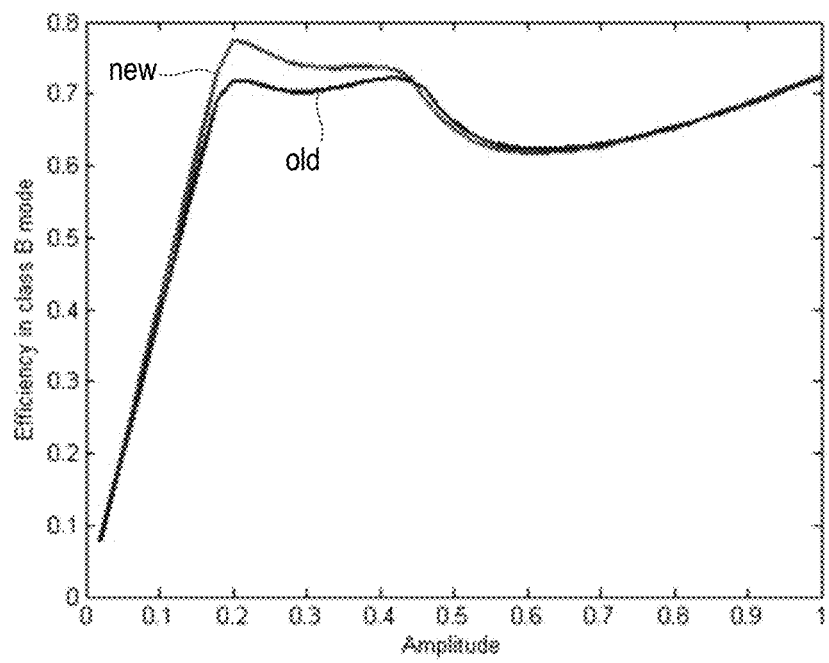
FIG. 7 compares efficiency curves for an amplifier with class B terminations and low-loss transistors with an amplifier according to embodiments of the invention.

It can be seen from FIG. 7 that the efficiency in the upper amplitude range is reduced about equally for the two amplifiers, while the new amplifier has substantially better efficiency in the lowest amplitude range, i.e. below 0.45 of full output.

Figure 8A:
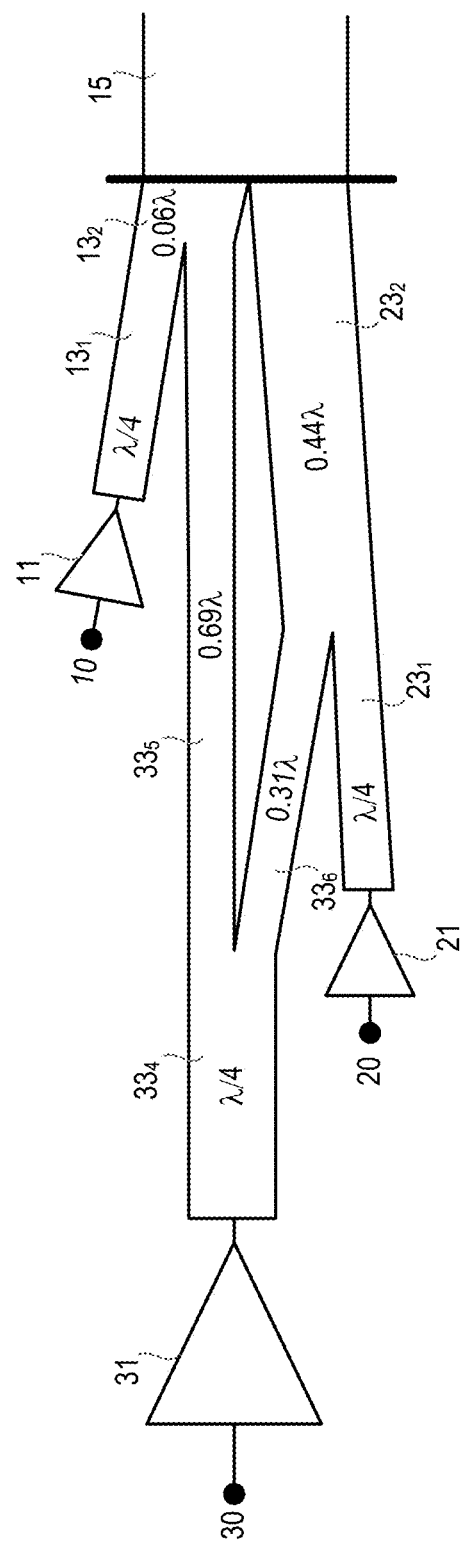
FIG. 8a shows an amplifier circuit according to another embodiment of the invention.

FIG. 8a shows an amplifier circuit according to another embodiment of the present invention, having essentially the same behaviour as shown in the embodiments of FIGS. 3 and 4.

The amplifier circuit 200 comprises a first amplifier 11 configured to amplify a first input signal 10. An output of the first amplifier 11 is coupled to an output node 15 via a first transmission line 13. The first transmission line 13 comprises a first portion $13_1$ having a first characteristic impedance and a first length, and a second portion $13_2$ having a second characteristic impedance and a second length.

The amplifier circuit 200 also comprises a second amplifier 21 configured to amplify a second input signal 20. An output of the second amplifier 21 is coupled to the output node 15 via a second transmission line 23. The second transmission line 23 comprises a first portion $23_1$ having a first characteristic impedance and a first length, and a second portion $23_2$ having a second characteristic impedance and a second length.

The amplifier circuit 200 also comprises an auxiliary amplifier 31 (also referred to herein as a peak amplifier) configured to amplify a third input signal 30. An output of the auxiliary amplifier 31 is coupled via an auxiliary transmission line network ($33_4$, $33_5$, $33_6$) to a first intersection between the first and second portions $13_1$, $13_2$ of the first transmission line 13, and to a second intersection between the first and second portions $23_1$, $23_2$ of the second transmission line 23.

In the embodiment of FIG. 8a the length of the first portion $13_1$ of the first transmission line 13 is different to the length of the second portion $13_2$ of the first transmission line 13, and/or wherein the length of the first portion $23_1$ of the second transmission line 23 is different to the length of the second portion $23_2$ of the second transmission line 23. For example, the first portion $13_1$ of the first transmission line 13 is shown having a length 0.25λ and the second portion $13_2$ of the first transmission line 13 shown having a length 0.06λ, with the first portion $23_1$ of the second transmission line 23 shown having a length 0.25λ, and the second portion $23_2$ of the second transmission line 23 shown having a length 0.44λ.

According to the embodiment shown in FIG. 8a, the characteristic impedance of the first portion $13_1$ of the first transmission line 13 is substantially N times the characteristic impedance of the second portion $13_2$ of the first transmission line 13. For example, in the embodiment of FIG. 8a the characteristic impedance of the first portion $13_1$ of the first transmission line 13 is substantially twice the characteristic impedance of the second portion $13_2$ of the first transmission line 13 (illustrated by the respective thicknesses of the first and second portions $13_1$, $13_2$ in FIG. 8a).

Likewise, the characteristic impedance of the first portion $23_1$ of the second transmission line 23 is substantially N times the characteristic impedance of the second portion $23_2$ of the second transmission line 23. For example, in the embodiment of FIG. 8a the characteristic impedance of the first portion $23_1$ of the second transmission line 23 is substantially twice the characteristic impedance of the second portion $23_2$ of the second transmission line 23 (illustrated by the respective thicknesses of the first and second portions $23_1$, $23_2$ in FIG. 8a).

In the embodiment of FIG. 8a it can also been seen that the characteristic impedances of the second portions $13_2$, $23_2$ of the first and second transmission lines 13, 23 are substantially N times the characteristic impedance of a load impedance $R_{LOAD}$ of the output node 15. For example, in the embodiment of FIG. 8a the characteristic impedances of the second portions $13_2$, $23_2$ of the first and second transmission lines 13, 23 are substantially twice the characteristic impedance of the load impedance of the output node 15 (again illustrated by the respective thicknesses of the second portions $13_2$, $23_2$ of the first and second transmission lines 13, 23 compared to the load impedance at the output node 15).

With regard to the auxiliary transmission line network in the embodiment of FIG. 8a, a first auxiliary transmission line comprises a first portion $33_4$ and a second portion $33_5$ coupling the output of the auxiliary amplifier 31 to the first intersection in the first transmission line 13. A second auxiliary transmission line comprises the first portion $33_4$ (i.e. common with the first auxiliary transmission line) and a second portion $33_6$ coupling the output of the auxiliary amplifier 31 to the second intersection of the second transmission line 23.

In the example of FIG. 8a the first portion $33_4$ of the first and second auxiliary transmission lines has a length equal to substantially an odd multiple of a quarter wavelength, for example 0.25λ. The second portions $33_5$ and $13_2$ sum to an odd multiple of a quarter wavelength. Furthermore, the first portion $33_4$ of the first and second auxiliary transmission lines has a characteristic admittance which is substantially equal to the sum of the characteristic admittances of the second portions $33_5$, $33_6$ of the first and second auxiliary transmission lines (as illustrated in FIG. 8a by the respective width of the transmissions lines).

Thus, according to the embodiment of FIG. 8a the output interaction network has quarter wavelength lines from the Chireix-pair amplifiers 11, 21 to the junctions or intersections (i.e. for the first portions of the first and second transmission lines), and the lengths of the wider lines (having lower characteristic impedance) from the junctions to the output slightly shorter and longer than a half (or zero, or other multiples of a half) wavelengths. The auxiliary or peak transistor 31 in this arrangement has first a common line of a quarter wavelength to a splitting point, and the lengths of the lines from the splitting point to the junctions are slightly longer and shorter than some odd multiples of quarter wavelengths.

Thus, in summary, in the example of FIG. 8a the first amplifier (fed by input 10) is connected by a quarter wavelength transmission line $13_1$ to a transmission line $13_2$ of lower characteristic impedance (illustrated by a wider line). This wider line has a length of 0.06λ in the example and is connected to the common output 15. To the junction where the wider transmission line $13_2$ starts is also connected an auxiliary transmission line of length 0.69λ, that originates at the output end of a quarter wave line $33_4$ that originates at the output of the auxiliary amplifier 31.

The second amplifier (fed by input 20) is connected by a quarter wavelength transmission line $23_1$ to a transmission line $23_2$ of lower characteristic impedance (illustrated by a wider line). This wider line has a length of 0.44λ in the example and is connected to the common output 15. To the junction where the wider transmission line $23_2$ starts is also connected an auxiliary transmission line of length 0.31λ, that originates at the output end of the quarter wave line $33_4$ that originates at the output of the auxiliary amplifier 31.

The narrower lines each have characteristic impedance of 4 times $R_{load}$ and the wider lines (including the quarter wave from amplifier 31) have a characteristic impedance of 2 times $R_{load}$.

Also in this output interaction network, amplifiers 11 and 21 form a Chireix pair which operates largely by itself at low output amplitudes. Auxiliary amplifier 31 has the function to provide output power only in the high output power range, while drawing very little DC power in the low range.

Figure 8B:
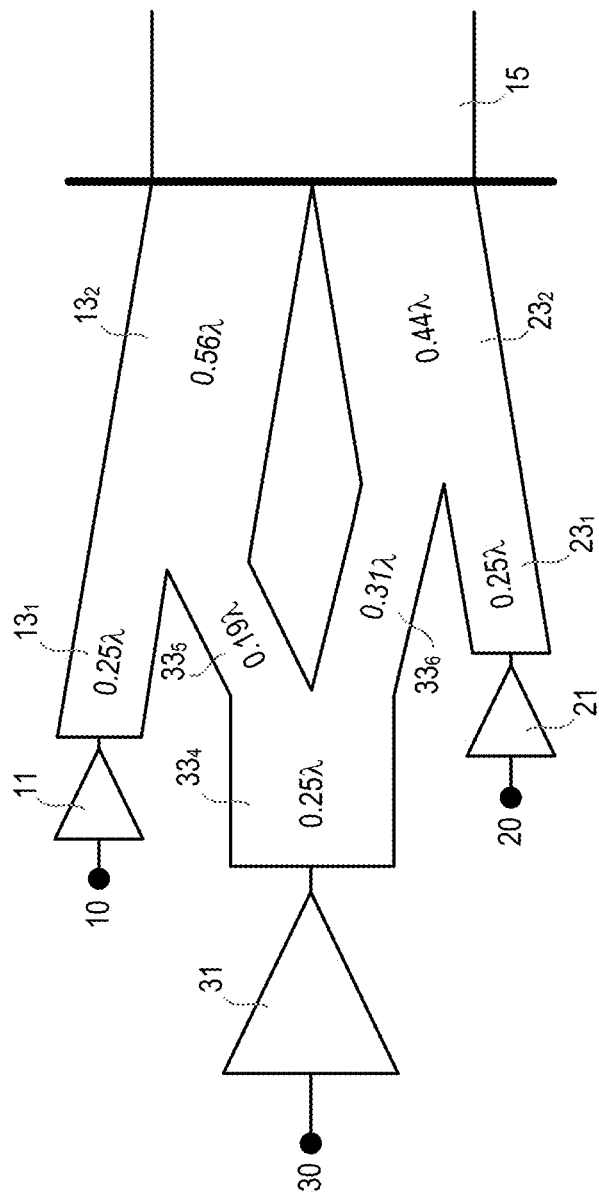
FIG. 8b shows an amplifier circuit according to another embodiment of the invention.

FIG. 8b shows another embodiment that is similar in structure to the embodiment of FIG. 8a, but whereby different values are used.

Figure 8C:
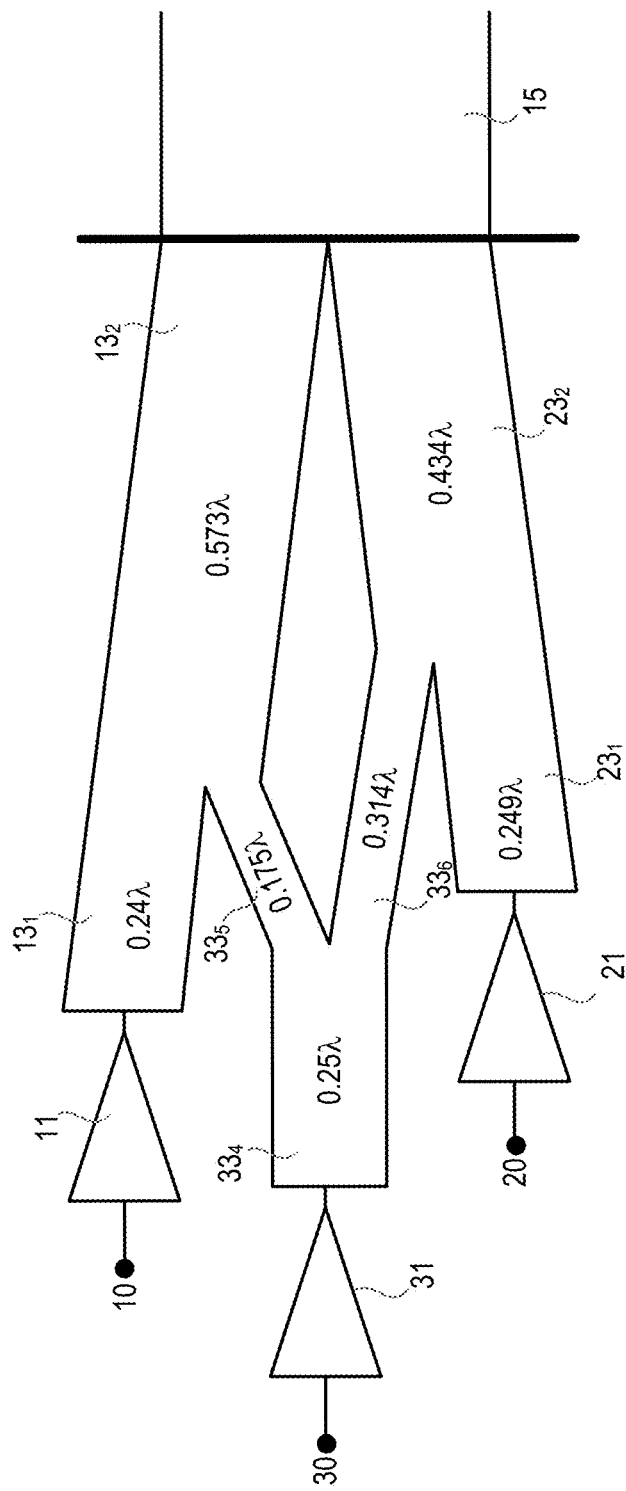
FIG. 8c shows an amplifier circuit according to another embodiment of the invention.

FIG. 8c shows a further embodiment that is similar in structure to the embodiment of FIG. 8b, but whereby different values are used. For example, the embodiment of FIG. 8c uses asymmetry in the lower end (by making one transistor slightly more optimal to start with). As a result the voltage cancellation of the embodiment of FIG. 8c is not necessarily as perfect, but the overall result for a 9 dB PAR Rayleigh distribution being used, for example, results in an improved average efficiency.

Figure 9:
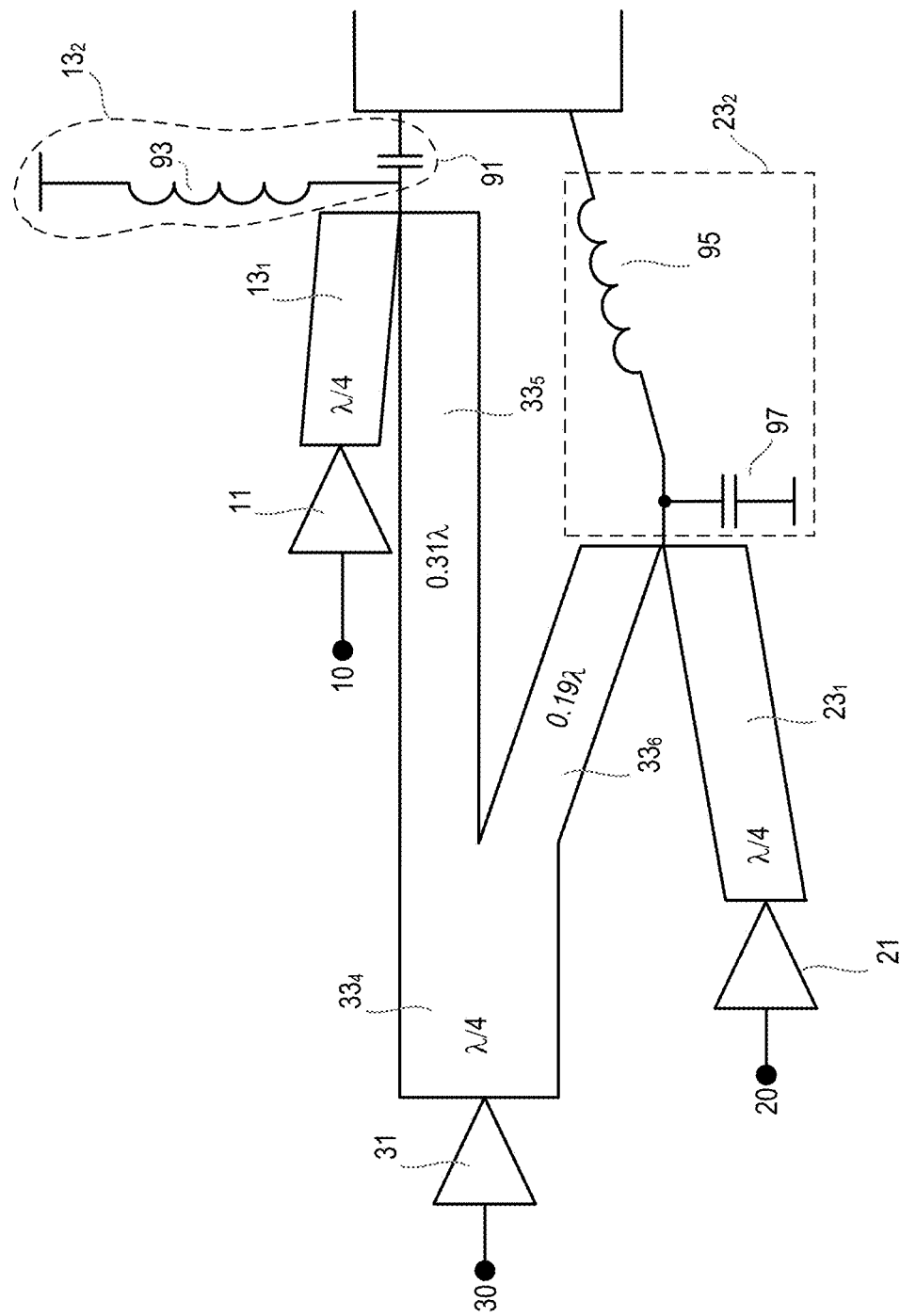
FIG. 9 shows an amplifier circuit according to another embodiment of the invention.

FIG. 9 shows an alternative circuit to FIG. 8a, in which the 0.06λ transmission line has been replaced by a L-circuit comprising a shunt capacitor 91 and series inductor 93, and wherein the 0.44λ transmission line has been replaced by a L-circuit comprising a shunt inductor 95 and series capacitor 97 (forming essentially a line with negative 0.06λ). It is noted that other equivalent circuits may be used to realise any portion of a transmission line, without departing from the scope of the invention as defined in the appended claims.

The transmission lines originating from the auxiliary amplifier 31 are shown as being kept as they were from the embodiment of FIG. 8a, except a reduction of a half wavelength from the 0.69λ transmission line in the transmission-line-only circuit. The quarter wavelength lines originating at amplifiers 11 and 21 also remain in the example.

By the arrangements described in the embodiments above, the auxiliary amplifier 31 is effectively decoupled from the output node 15, which makes it possible to have another shape for the RF voltage at the auxiliary amplifier 31 in the output amplitude range in which it is not active. This voltage is obtained as a vector sum of the RF currents from the Chireix pair amplifiers 11, 21. A benefit of this is that the auxiliary amplifier 31 performs the same task as in prior art Chireix-Doherty amplifiers in the upper part of the amplitude range, while it is designed to have lower RF voltage swing in the low amplitude range.

Figure 10:
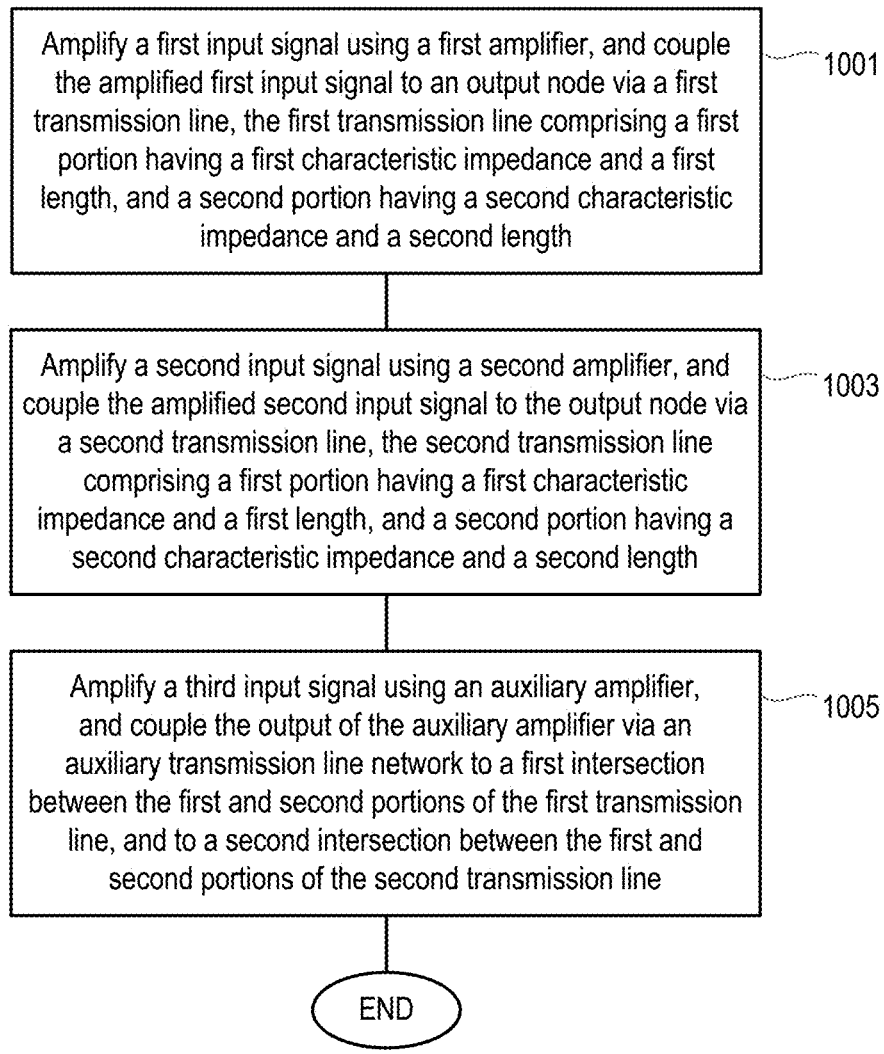
FIG. 10 shows a method according to another embodiment of the invention.

FIG. 10 shows a method in an amplifier circuit according to another embodiment of the invention. The method comprises the step of amplifying a first input signal using a first amplifier, and coupling the amplified first input signal to an output node via a first transmission line, the first transmission line comprising a first portion having a first characteristic impedance and a first length, and a second portion having a second characteristic impedance and a second length, step 1001.

In step 1003 a second input signal 20 is amplified using a second amplifier 21, with the amplified second input signal coupled to the output node 15 via a second transmission line, the second transmission line comprising a first portion having a first characteristic impedance and a first length, and a second portion having a second characteristic impedance and a second length.

A third input signal is amplified using an auxiliary amplifier, with the output of the auxiliary amplifier coupled via an auxiliary transmission line network to a first intersection between the first and second portions of the first transmission line, and to a second intersection between the first and second portions of the second transmission line, step 1005.

The lengths and/or characteristic impedances of the first and second transmission lines 13, 23 and the auxiliary transmission line network $33_1$, $33_2$ are configured such that, during the amplification steps mentioned above, a low voltage swing is experienced by the auxiliary amplifier 31 for output signals having a low amplitude range.

It is noted that the structures described in the embodiments of the invention above can be modified to accommodate other sizes of transistors, for example making the auxiliary transistor bigger or smaller. The transmission lines' (or equivalent circuits') characteristic impedances can then be adjusted accordingly, so that the amplifiers can all deliver their maximum output power during signal peaks. According to one embodiment, a general rule for maximizing output power is to have all transmission line impedances in the output network equal to the Ropt of the amplifier (transistor) it is connected to. In junctions, the sum of admittance (inverse of impedance) of the lines on each side can be made equal. i.e. when two lines join, and wherein the outgoing line has a characteristic impedance equal to that of the parallel coupling of the incoming lines.

Transistors in general act as controlled RF current sources, so the shape of the amplitudes and phases (relative to that of the output) of the RF currents as functions of the output amplitude also suggest the desired voltage shaping that can be performed to the input signals (gate drive voltages). The actual shapes can take into account that the voltage-to-current conversion (transconductance) in the transistors is more or less nonlinear, and that the RF voltage swing can influence the output current as well (especially via saturation when close to the upper limit).

It is noted that for all the transmission lines shown in the example embodiments above, these can be replaced by equivalent circuits such as combinations of lumped elements. For example, the quarter wave lines can be replaced by LC, pi-or T-networks with reactances equal in magnitude to the characteristic impedance of the replaced quarter wave line. T networks, L networks, single or in cascade can also be used.

The embodiments of the invention therefore provide a new type of amplifier circuit with Chireix-Doherty behaviour which, at low output power levels, has extremely low sensitivity to shunt loss in the peak (auxiliary) transistor. The auxiliary transistor can thus both be big and use a cheaper transistor technology, and the amplifier will still have high average efficiency.

Substantially increased peak power can therefore be obtained without the need to use expensive transistors. The problems usually associated with peak reduction, such as increased EVM, increased average output power, increased DC power consumption, and increased need for cooling, can therefore be mitigated without drawbacks.

As can be seen from the above, the embodiments of the invention share the feature of a common peak transistor that is distributed to points along both branches of the Chireix pair. In each embodiment the equivalent line lengths through both paths from the peak transistor to the common output are of equal length.

The embodiments of the invention are applicable to other amplifier configurations, in addition to the specific examples provided in the description, including amplifier arrangements having even more wideband characteristics.

It is noted that the amplifier circuits and methods described in the embodiments of the invention may be used in any terminal of a telecommunications network including, but not limited to, radio base stations or eNodeBs (or other similar nodes in other telecommunication platforms), mobile or portable terminals, or any other device which requires a wideband amplifier with good efficiency across the bandwidth.

It should also be noted that, although the embodiments of the invention have been described in relation to a telecommunications environment, the embodiments of the invention may also be used with any application whereby a wideband amplifier is required with good efficiency across the bandwidth, including non-telecommunication applications.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. An amplifier circuit comprising:
   a first amplifier configured to amplify a first input signal, wherein an output of the first amplifier is coupled to an output node via a first transmission line, the first transmission line comprising a first portion having a first characteristic impedance and a first length, and a second portion having a second characteristic impedance and a second length;
   a second amplifier configured to amplify a second input signal, wherein an output of the second amplifier is coupled to the output node via a second transmission line, the second transmission line comprising a first portion having a first characteristic impedance and a first length, and a second portion having a second characteristic impedance and a second length; and
   an auxiliary amplifier configured to amplify a third input signal, wherein an output of the auxiliary amplifier is coupled via an auxiliary transmission line network to a first intersection between the first and second portions of the first transmission line, and to a second intersection between the first and second portions of the second transmission line; and
   wherein the sum of the lengths of the first and second portions of the first transmission line is different to the sum of the lengths of the first and second portions of the second transmission line.

2. The amplifier circuit as claimed in claim 1, wherein the length of the first portion of the first transmission line is substantially equal to the length of the second portion of the first transmission line and/or wherein the length of the first portion of the second transmission line is substantially equal to the length of the second portion of the second transmission line.

3. The amplifier circuit as claimed in claim 1, wherein the first and/or second portions of the first transmission line are a first predetermined length shorter than an odd multiple of a quarter wavelength, and wherein the first and/or second portions of the second transmission line are a second predetermined length longer than an odd multiple of a quarter wavelength.

4. The amplifier circuit as claimed in claim 3, wherein the first predetermined length is substantially equal to the second predetermined length.

5. The amplifier circuit as claimed in claim 3, wherein the first and/or second portions of the first transmission line comprise a quarter wave line that is effectively shortened using one or more shunt inductors, and wherein the first and/or second portions of the second transmission line comprise a quarter wave line which is effectively lengthened using one or more shunt capacitors.

6. The amplifier circuit as claimed in claim 1, wherein the sum of the lengths of the first portions of the first and second transmission lines are substantially equal to 0.5 wavelengths, or multiple thereof, and/or wherein the sum of the lengths of the second portions of the first and second transmission lines are substantially equal to 0.5 wavelengths, or a multiple thereof.

7. The amplifier circuit as claimed in claim 1, wherein the length of the first portion of the first transmission line is different to the length of the second portion of the first transmission line and/or wherein the length of the first portion of the second transmission line is different to the length of the second portion of the second transmission line.

8. The amplifier circuit as claimed in claim 1, wherein the characteristic impedance of the first portion of the first transmission line is substantially N times the characteristic impedance of the second portion of the first transmission line and/or wherein the characteristic impedance of the first portion of the second transmission line is substantially integer N times the characteristic impedance of the second portion of the second transmission line.

9. The amplifier circuit as claimed in claim 8, wherein the characteristic impedances of the second portions of the first and second transmission lines are substantially integer N times the characteristic impedance of a load impedance of the output node.

10. The amplifier circuit as claimed in claim 1, wherein the auxiliary transmission line network comprises:
    a first auxiliary transmission line coupling the output of the auxiliary amplifier to the first intersection in the first transmission line; and
    a second auxiliary transmission line coupling the output of the auxiliary amplifier to the second intersection of the second transmission line.

11. The amplifier circuit as claimed in claim 10, wherein:
    the length of the first auxiliary transmission line is longer than the length of the second auxiliary transmission line; or
    the length of the first auxiliary transmission line and second auxiliary transmission line are an equal predetermined length longer and shorter, respectively, than integer N times a quarter wavelength.

12. The amplifier circuit as claimed in claim 10, wherein:
    the characteristic impedance of the first and second auxiliary transmission lines are substantially equal; or
    the characteristic impedance of the first and second auxiliary transmission lines are substantially equal to the characteristic impedance of the first portions of the first and second transmission lines.

13. The amplifier circuit as claimed in claim 1, wherein the auxiliary transmission line network comprises:
    a first auxiliary transmission line comprising a first portion and a second portion coupling the output of the auxiliary amplifier to the first intersection in the first transmission line; and
    a second auxiliary transmission line comprising the first portion and a second portion coupling the output of the auxiliary amplifier to the second intersection of the second transmission line.

14. The amplifier circuit as claimed in claim 13, wherein:
    the first portion of the first and second auxiliary transmission lines has a length equal to substantially an odd multiple of a quarter wavelength, and wherein the second portions of the first and second auxiliary transmission lines have a length which sum to substantially integer N times an odd multiple of a quarter wavelength; and
    the first portion of the first and second auxiliary transmission lines has a characteristic impedance which is substantially equal to the sum of the characteristic impedances of the second portions of the first and second auxiliary transmission lines.

15. The amplifier circuit as claimed in claim 1, wherein the effective length seen from the output of the auxiliary amplifier to the output node is equal along first and second paths from the output of the auxiliary amplifier to the output node.

16. The amplifier circuit as claimed in claim 15, wherein the effective length is equal to an odd multiple of a quarter of a wavelength.

17. A method in an amplifier circuit, the method comprising the steps of:

amplifying a first input signal using a first amplifier, and coupling the amplified first input signal to an output node via a first transmission line, the first transmission line comprising a first portion having a first characteristic impedance and a first length, and a second portion having a second characteristic impedance and a second length;

amplifying a second input signal using a second amplifier, and coupling the amplified second input signal to the output node via a second transmission line, the second transmission line comprising a first portion having a first characteristic impedance and a first length, and a second portion having a second characteristic impedance and a second length; and amplifying a third input signal using an auxiliary amplifier, and coupling the output of the auxiliary amplifier via an auxiliary transmission line network to a first intersection between the first and second portions of the first transmission line, and to a second intersection between the first and second portions of the second transmission line; and wherein the sum of the lengths of the first and second portions of the first transmission line is different to the sum of the lengths of the first and second portions of the second transmission line.

* * * * *